United States Patent
Birkle et al.

[11] Patent Number: 5,196,907
[45] Date of Patent: Mar. 23, 1993

[54] METAL INSULATOR SEMICONDUCTOR FIELD EFFECT TRANSISTOR

[75] Inventors: Siegfried Birkle, Höchstadt a/Aisch; Johann Kammermaier, Unterhaching, both of Fed. Rep. of Germany

[73] Assignee: Siemens Aktiengesellschaft, Munich, Fed. Rep. of Germany

[21] Appl. No.: 924,422

[22] Filed: Jul. 31, 1992

Related U.S. Application Data

[63] Continuation of Ser. No. 745,420, Aug. 15, 1991, abandoned.

Foreign Application Priority Data

Aug. 20, 1990 [DE] Fed. Rep. of Germany ....... 4026314

[51] Int. Cl.$^5$ .................................... H01L 29/78
[52] U.S. Cl. .................................... 257/289
[58] Field of Search ............ 357/23.2, 23.15, 16

[56] References Cited

U.S. PATENT DOCUMENTS

| | | | |
|---|---|---|---|
| 4,160,261 | 7/1979 | Casey et al. | 357/23.2 |
| 4,697,197 | 9/1987 | Dresner | 357/23.2 |
| 4,916,510 | 4/1990 | Sano et al. | 357/23.2 |
| 5,036,374 | 7/1991 | Shimbo | 357/23.2 |

OTHER PUBLICATIONS

J. Appl. Phys., vol. 62 (Nov. 1987), pp. 3799–3802.
Appl. Phys., vol. A 48 (Jan 1989), pp. 549–558.
W. Kellner, H. Kniepkamp "*GaAs-Feldeffekttransistoren*", 2nd Ed., (Jan. 1989), Springer-Verlag, pp. 19–29 & 55.

*Primary Examiner*—John D. Lee
*Assistant Examiner*—Robert E. Wise
*Attorney, Agent, or Firm*—Kenyon & Kenyon

[57] ABSTRACT

A Metal Insulator Semiconductor Field-Effect Transistor (MISFET) has an insulating layer arranged between a gate electrode and a semiconductor substrate. The insulating layer is a layer of amorphous, hydrogenated carbon (a-C:H) with a thickness—in the region of the gate electrode—of up to 1 μm, and with a resistivity ($\eta$) greater than or equal to $10^6$ Ω·cm at the boundary surface to the semiconductor substrate. The semiconductor substrate consists of a semiconductor material other than silicon.

20 Claims, 2 Drawing Sheets

METAL INSULATOR SEMICONDUCTOR FIELD EFFECT TRANSISTOR

This application is a continuation of application Ser. No. 07/745,420, filed on Aug. 15, 1991, now abandoned.

BACKGROUND OF THE INVENTION

The present invention relates generally to Metal Insulator semiconductor Effect Transistors (MISFETs), and more particularly to a MISFET having an insulating layer arranged between a gate electrode and a semiconductor substrate.

When two layers with different electrical and chemical properties adjoin each other, generally the result is a so-called heterostructure. These heterostructures have fundamentally new electrical characteristics which can be controlled through technological means as disclosed in *J. Appl. Phys.*, vol. 62 (1987), pp 3799 to 3802, and *Appl. Phys.*, vol. A 48 (1989), pp 549 to 558). A decisive and important role is played by heterostructures in FETs, which are manufactured predominantly with silicon (Si) using a highly developed process technique. At the present time, the application of the FET principle to other semiconductor materials, such as Ge, GaAs, GaP and InP, which to an extent have better electronic properties, is very restricted. This is because it is not possible to produce an insulating layer, in the form of an oxide of the semiconductor material ("gate oxide"), that is suited for interconnecting the gate electrode and that is free of boundary charges—as in Metal Oxide Semiconductor (MOS) technology—and because other insulating layers as well, for example of plastic, as is the case with MISFETs, cannot be connected to the semiconductor surface so that they are free of boundary charges.

To produce field-effect transistors using semiconductor materials other than silicon, the metal Semiconductor Field Effect Transistor (MESFET) principle and the Junction FET (JFET) principle are preferably applied instead of the MISFET principle, as disclosed in W. Kellner, H. Kniepkamp *GaAs Feldeffekttransistoren* (GaAs Field-Effect Transistors), 2nd edition (1989), Springer Publishing House, pp 19 to 29 and 55. These principles are based on the use of the Sohottky barrier that forms between the gate electrode and the semiconductor material or on the use of the potential barrier of a p-n junction. High switching rates can in fact be achieved with such systems, however generally this means relatively high leakage currents. A fundamental disadvantage is also a comparatively low blocking voltage, which has a considerable adverse effect on the operating voltage for the system.

Generally, the following demands are placed on insulating layers in MISFETs, particularly on those based on GaAs and InP:

deposition in a low-temperature process to avoid material damage to the semiconductor material, that is splitting-off of certain components, e.g. As in the case of GaAs;

stable adhesion to the semiconductor surface;

saturation of possible existing free valences in the semiconductor surface (so-called "dangling bonds") to eliminate surface defects or recombination centers;

production of heterostructures having good recharging capability with the semiconductor; and low leakage currents or no pin holes.

The present invention is directed to the problem of developing a MISFET having an insulating layer arranged between a gate electrode and a semiconductor substrate in such a way that the boundary surface between the insulator and the semiconductor will have few defects.

SUMMARY OF THE INVENTION

The present invention solves this problem by providing an insulating layer of amorphous, hydrogenated carbon (a-C:H) with a thickness—in the region of the gate electrode—of up to 1 $\mu$m, and with a resistivity ($\rho$) greater than or equal to $10^6 \Omega\cdot\text{cm}$ ($\rho \geq 10^6 \Omega\cdot\text{cm}$) at the boundary surface to the semiconductor substrate, and by having a semiconductor substrate that consists of a semiconductor material other than silicon.

Thus a-C:H semiconductor-heterostructures are used to produce MISFETs according to the invention. These heterostructures exhibit a stable boundary surface with little recombination.

Amorphous, hydrogenated carbon (a-C:H) is a carbon material which features an amorphous carbon network. This modification of carbon obtains its special properties, such as chemical resistance and electrical insulation, from the side-by-side arrangement of tetrahedral (sp$^3$) and trigonal (sp$^2$) hybridization. The amorphous structure is stabilized by incorporating hydrogen (about 10 to 40 atomic percentage). Layers made of amorphous, hydrogenated carbon (a-C:H) are electrically insulating. The resistivity ($\rho$) of this material can be adjusted to more than $10^{13} \Omega\cdot\text{cm}$ ($\rho > 10^{16} \Omega\cdot\text{cm}$).

The MISFETs according to the invention feature an a-C:H layer with a resistivity ($\rho$) greater than or equal to $10^6 \Omega\cdot\text{cm}$ ($\rho \geq 10^6 \Omega\cdot\text{cm}$) at the boundary surface to the semiconductor substrate. Preferably the resistivity ($\rho$) of the boundary surface is less than or equal to $10^9 \Omega\cdot\text{cm}$ ($\rho \leq 10^9 \Omega\cdot\text{cm}$). The total resistance of the insulating layer consisting of a-C:H is thereby at least as great as the resistance of the boundary surface. Also, the boundary surface preferably has a thickness of up to 50 nm.

MISFETs according to the invention preferably feature semiconductor substrates made of materials with high charge carrier mobility—in particular Ge, AlP, GaAs, GaP, GaSb, InAs, InP and InSb. Besides these materials, other materials such as BN and SiC, for example, are considered. The semiconductor substrate advantageously consists of monocrystalline material.

According to the present invention, to manufacture MISFETs or a-C:H semiconductor heterostructures, an a-C:H layer of a thickness of up to 1 $\mu$m is applied to a semiconductor substrate of monocrystalline material (wafer), or to a polycrystalline or amorphous thin layer of the semiconductor material, which are each provided with a source and drain. This insulating layer covers in a usual manner the area of the semiconductor substrate situated between the source and the drain. The a-C:H deposition takes place by means of a high-frequency, low-pressure plasma deposition of gaseous hydrocarbons, optionally in the presence of hydrogen. By regulating the plasma conditions, one can thereby control the properties of a-C:H, such as the resistivity ($\rho$) and the defect concentration, within a relatively broad range.

The insulating layer is advantageously produced first of all by a separate a-C:H layer with a thickness of more or less up to 50 nm—with the exclusion of air—with a resistivity of up to $10^9 \Omega\cdot\text{cm}$ ($\rho \leq 10^9 \Omega\cdot\text{cm}$), and an optical energy gap of up to 1.1 eV. This type of layer produces a boundary surface that is free of charge. A second a-C:H layer with a higher resistivity ($\rho$), i.e. a resistivity ($\rho$) greater than $10^9 \Omega \cdot cm$ ($\rho > 10^9$), is then deposited on to the first a-C:H layer in the same plasma process—with modified plasma conditions (increased pressure and/or reduced power density). This a-C:H layer is roughly up to 1 $\mu$m thick. The increase in resistivity can take place thereby either abruptly or continuously.

Preferably, the following conditions prevail when the a-C:H layers are deposited:

For layers with a resistivity ($\rho$) $\leq 10^9 \Omega \cdot cm$:
pressure: $\leq 50$ Pa
power density: $\leq 5$ W·cm$^{-2}$
DC-self-bias voltage: $< -800$V;

b) For layers with a resistivity ($\rho$) $> 10^9 \Omega \cdot cm$:
pressure: up to 200 Pa
power density: up to 0.5 W·cm$^{-2}$
DC-self-bias voltage: $> -400$V.

To guarantee an excellent capacity for bonding with metal, such as aluminum, in the region of the source and the drain, the a-C:H layer is deposited in a structured manner, i.e. only in the area of the gate channel. Also, the semiconductor substrate can be advantageously covered by an a-C:H layer in the area outside of the source and the drain, i.e. in the areas situated away from the insulating layer. Furthermore, if necessary, the a-C:H layer can have a thinner shape in the vicinity of the gate electrode than in the areas bordering on the source or the drain. This can be effected, for example, through a covering or a subsequent etching operation in a plasma process. The charges on the gate electrode are prevented from leaking as a result of the high dielectric resistance of a-C:H.

To attain a stable, thin barrier layer consisting of a-C:H, with few electrically active defects in the boundary surface to the semiconductor substrate (in the coverage area of the gate electrode), it is a decisive advantage to achieve—due to the non-thermal character of the a-C:H deposition—bonding conditions in the boundary surface, which are not feasible in thermal processes, such as Chemical Vapor Deposition (CVD). This helps to keep charge-carrier losses resulting from recombination to a minimum in the thin a-C:H layer and in the boundary surface to the semiconductor substrate—due to a low density of states. In this respect, an advantageous refinement of the method for manufacturing the a-C:H semiconductor heterostructure also consists in subjecting the semiconductor surface—before the a-C:H deposition—to a plasma pretreatment, for example with argon or hydrogen. In this manner disturbing impurities, in particular oxides, are removed. With such a procedure, any free valences that might be produced are saturated by the subsequently deposited a-C:H layer, when the semiconductor surface is kept free of air.

With MISFETs, which according to the present invention exhibit a-C:H semiconductor heterostructures, systems can be realized—with respect to gate voltage level and leakage rate—which are comparable to systems manufactured according to MOS techniques and are superior to MESFET or JFET systems. Moreover, the technological expenditure for the MISFETs is less than for the known MOSFETs.

DETAILED DESCRIPTION

Figure 1:
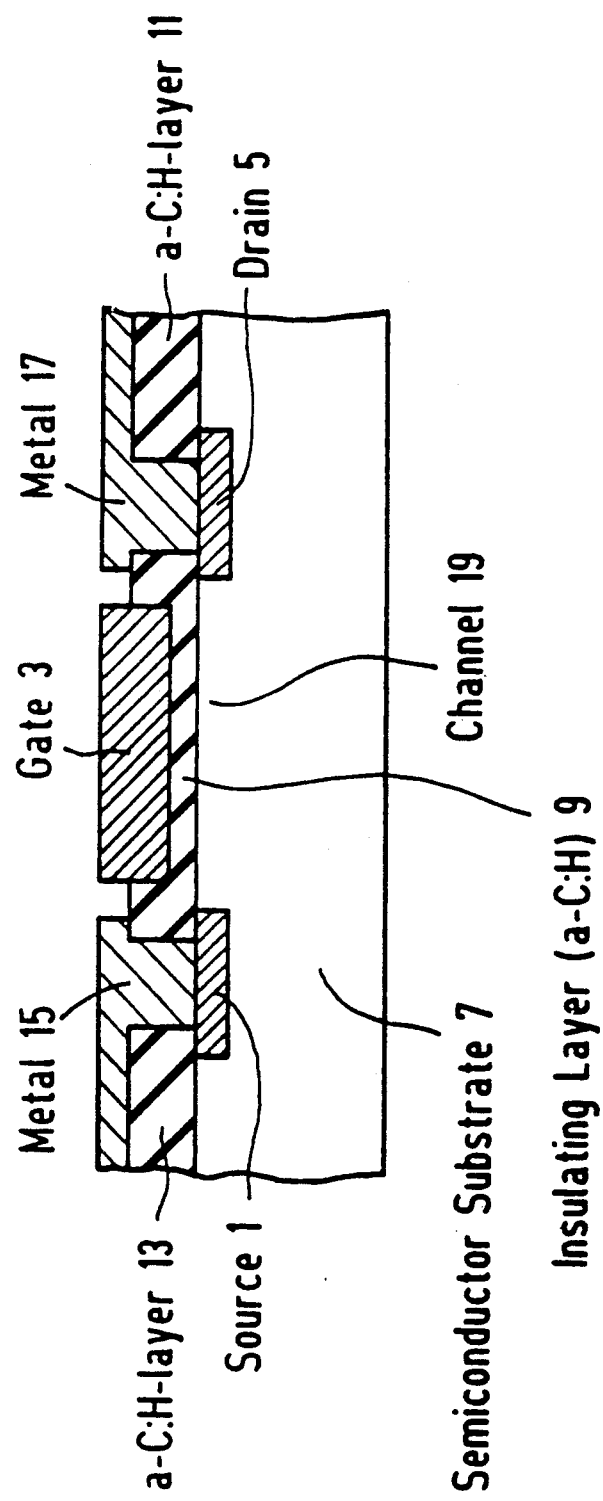
FIG. 1 illustrates an embodiment of the present invention.

Referring to the figures, the MISFET shown has a source 1, a gate 3, a drain 5, a semiconductor a-C:H substrate 7, an insulating layer 9, and an amorphous hydrogenated carbon (a-C:H) layer 11 in the region of the drain and another amorphous hydrogenated carbon layer (a-C:H) 13 in the region of the source, as well as metal layers 15, 17 above the source and the drain, respectively. A 0.1 $\mu$m thick a-C:H layer is deposited on a p-doped substrate made of monocrystalline GaAs with a charge-carrier concentration of approximately $10^{18}$ cm$^{-3}$.

The GaS p-doped substrate had already undergone a pretreatment in an argon or hydrogen plasma (under the conditions described in the following with respect to pressure and energy). The plasma deposition takes place by means of Radio Frequency (RF) excitation and by means of a direct-current (DC) self-bias voltage formed as a result of a capacitive energy coupling. Methane is used as the process gas. The working pressure amounts to 20 Pa. At a plasma power density of 2.5 W·cm$^{-2}$ on the substrate surface and a DC self-bias voltage of $-900$V, one obtains an a-C:H layer with an optical energy gap of 0.9 eV and a resistivity ($\rho$) of $5 \times 10^7 \Omega \cdot cm$. Current-voltage (I-U) measurements on the obtained a-C:H/GaAs heterostructure show characteristic diode properties with a blocking voltage of around 1.5V and a leakage current less than 1 mA·cm$^{-2}$.

Figure 2:
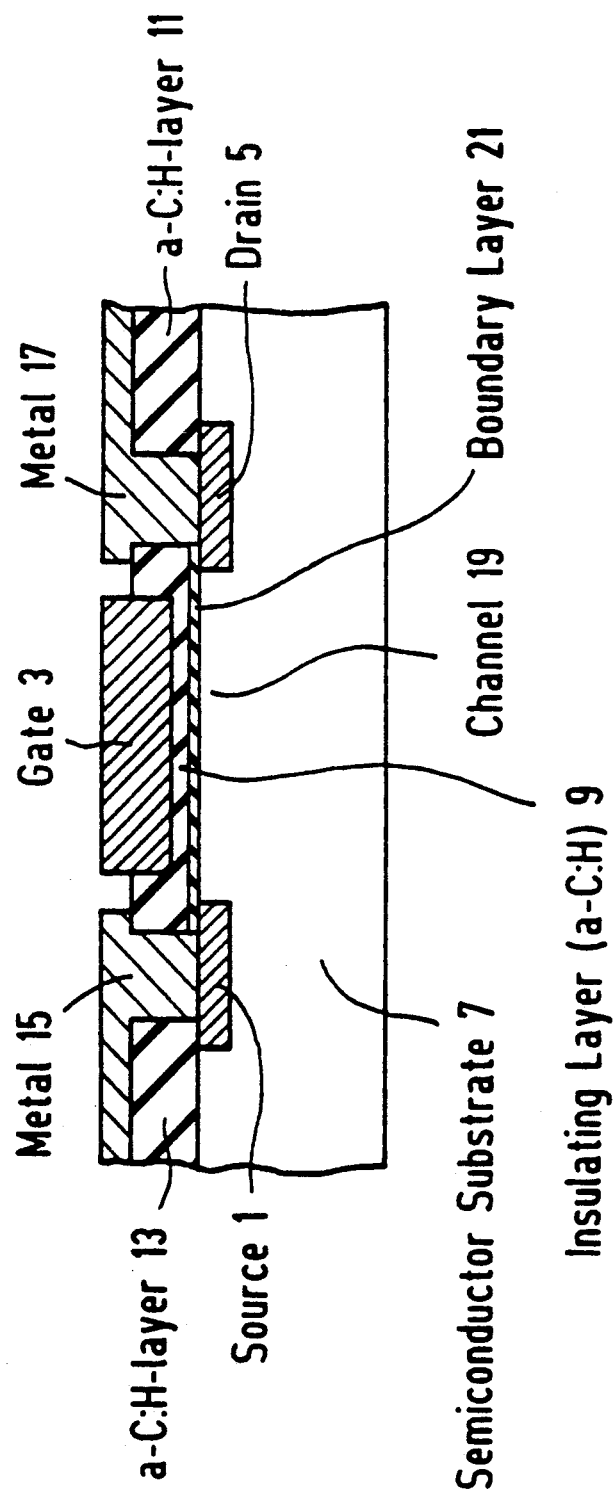
FIG. 2 illustrates an embodiment of the present invention with the advantageous boundary layer.

Referring to FIG. 2, the insulating layer 9 is shown as well as a boundary layer 21 (not to scale). This advantageous insulating layer is advantageously produced first of all by a separate a-C:H layer 21 with a thickness of more or less up to 50 nm—with the exclusion of air—with a resistivity of up to $10^9 \Omega \cdot cm$ ($\rho \leq 10^9 \Omega \cdot cm$), and an optical energy gap of up to 1.1 eV. This type of layer 21 produces a boundary surface that is free of charge. A second a-C:H layer 9 with a higher resistivity ($\rho$), i.e. a resistivity ($\rho$) greater than $10^9 \Omega \cdot cm$ ($\rho > 10^9$), is then deposited on to the first a-C:H layer 21 in the same plasma process—with modified plasma conditions (increased pressure and/or reduced power density). This a-C:H layer 9 is roughly up to 1 $\mu$m thick. The increase in resistivity can take place thereby either abruptly or continuously.

What is claimed is:

1. A metal insulator semiconductor field-effect transistor (MISFET) comprising:
   a) a gate electrode;
   b) a semiconductor substrate composed of a semiconductor material other than silicon; and
   c) an insulating layer disposed between said gate electrode and said semiconductor substrate, composed of amorphous, hydrogenated carbon (a-C:H), having a thickness in the region of the gate electrode less than or equal to 1 $\mu$m, and having a boundary surface to the semiconductor substrate with a resistivity ($\rho$) of greater than or equal to $10^6 \Omega \cdot cm$.

2. The MISFET according to claim 1, wherein the boundary surface comprises a resistivity ($\rho$) less than or equal to $10^9 \Omega \cdot cm$.

3. The MISFET according to claim 2, wherein the boundary surface comprises a thickness less than or equal to 50 nm.

4. The MISFET according to claim 3, wherein the semiconductor substrate comprises a monocrystalline material.

5. The MISFET according to claim 4, wherein the semiconductor material is selected from the group consisting of Ge, AlP, GaAs, GaP, GaSb, InAs, InP and InSb.

6. The MISFET according to claim 3, wherein the semiconductor material is selected from the group consisting of Ge, AlP, GaAs, GaP, GaSb, InAs, InP and InSb.

7. The MISFET according to claim 2, wherein the semiconductor substrate comprises a monocrystalline material.

8. The MISFET according to claim 7, wherein the semiconductor material is selected from the group consisting of Ge, AlP, GaAs, GaP, GaSb, InAs, InP and InSb.

9. The MISFET according to claim 2, wherein the semiconductor material is selected from the group consisting of Ge, AlP, GaAs, GaP, GaSb, InAs, InP and InSb.

10. The MISFET according to claim 2, further comprising a source, a drain, and an a-C:H layer covering the semiconductor substrate in an area outside of the source and the drain.

11. The MISFET according to claim 1, wherein the boundary surface comprises a thickness less than or equal to 50 nm.

12. The MISFET according to claim 11, wherein the semiconductor substrate comprises a monocrystalline material.

13. The MISFET according to claim 12, wherein the semiconductor material is selected from the group consisting of Ge, AlP, GaAs, GaP, GaSb, InAs, InP and InSb.

14. The MISFET according to claim 11, wherein the semiconductor material is selected from the group consisting of Ge, AlP, GaAs, GaP, GaSb, InAs, InP and InSb.

15. The MISFET according to claim 11, further comprising a source, a drain, and an a-C:H layer covering the semiconductor substrate in an area outside of the source and the drain.

16. The MISFET according to claim 1, wherein the semiconductor substrate comprises a monocrystalline material.

17. The MISFET according to claim 16, wherein the semiconductor material is selected from the group consisting of Ge, AlP, GaAs, GaP, GaSb, InAs, InP and InSb.

18. The MISFET according to claim 1, wherein the semiconductor material is selected from the group consisting of Ge, AlP, GaAs, GaP, GaSb, InAs, InP and InSb.

19. The MISFET according to claim 1, further comprising a source, a drain, and an amorphous, hydrogenated carbon (a-C:H) layer covering the semiconductor substrate in an area outside of the source and the drain.

20. The MISFET according to claim 1, wherein the a-C:H layer is produced by a high-frequency, low-pressure plasma deposition of gaseous hydrocarbons.

* * * * *